(12) United States Patent
Kim et al.

(10) Patent No.: US 10,310,648 B2
(45) Date of Patent: Jun. 4, 2019

(54) METHOD FOR FABRICATING REINFORCED GLASS SUBSTRATE, METHOD FOR FABRICATING DISPLAY DEVICE AND THE DISPLAY DEVICE

(71) Applicant: SAMSUNG DISPLAY CO., LTD., Yongin-si, Gyeonggi-do (KR)

(72) Inventors: Seung Kim, Seongnam-si (KR); Hoikwan Lee, Anseong-si (KR); Seungho Kim, Asan-si (KR); Jeongwoo Park, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 114 days.

(21) Appl. No.: 15/472,498

(22) Filed: Mar. 29, 2017

(65) Prior Publication Data

US 2017/0285818 A1    Oct. 5, 2017

(30) Foreign Application Priority Data

Mar. 30, 2016  (KR) .......................... 10-2016-0038599

(51) Int. Cl.
| | |
|---|---|
| *B32B 3/02* | (2006.01) |
| *G06F 3/041* | (2006.01) |
| *G06F 3/044* | (2006.01) |
| *H01L 51/00* | (2006.01) |
| *H01L 27/12* | (2006.01) |
| *H01L 27/32* | (2006.01) |

(52) U.S. Cl.
CPC ............ *G06F 3/0412* (2013.01); *G06F 3/044* (2013.01); *H01L 51/0096* (2013.01); *G06F 2203/04103* (2013.01); *H01L 27/1218* (2013.01); *H01L 27/323* (2013.01); *H01L 27/3244* (2013.01)

(58) Field of Classification Search
CPC .................. G06F 3/0412; G06F 3/044; G06F 2203/04103; H01L 27/1218; H01L 27/323; H01L 27/3244; H01L 51/0096
See application file for complete search history.

(56) References Cited

U.S. PATENT DOCUMENTS

| | | | |
|---|---|---|---|
| 8,959,953 B2 | 2/2015 | Varshneya | |
| 2012/0135177 A1* | 5/2012 | Cornejo | ................. B26F 3/002 428/43 |
| 2014/0178663 A1 | 6/2014 | Varshneya et al. | |
| 2015/0030838 A1* | 1/2015 | Sellier | .................... C03C 3/085 428/220 |
| 2015/0158756 A1 | 6/2015 | Varshneya | |

FOREIGN PATENT DOCUMENTS

| | | |
|---|---|---|
| KR | 10-1184259 B1 | 9/2012 |
| KR | 10-2012-0134892 A | 12/2012 |
| KR | 10-1409574 B1 | 6/2014 |
| KR | 10-2014-0101288 A | 8/2014 |
| KR | 10-2016-0016156 A | 2/2016 |

\* cited by examiner

*Primary Examiner* — Elizabeth E Mulvaney
(74) *Attorney, Agent, or Firm* — Lee & Morse, P.C.

(57) ABSTRACT

A method for fabricating a reinforced glass substrate includes forming a plurality of groove patterns in at least one surface of a plate glass, applying an ion exchange paste to the at least one surface in which the groove patterns are formed, applying an electric field to the plate glass coated with the ion exchange paste to form a reinforced plate glass, and cutting the reinforced plate glass to form a reinforced glass substrate.

20 Claims, 17 Drawing Sheets

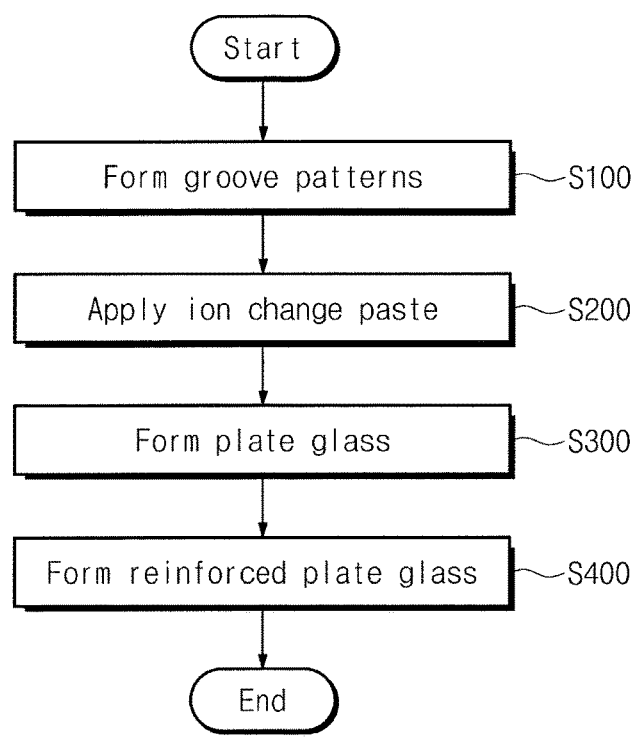

FIG. 14C
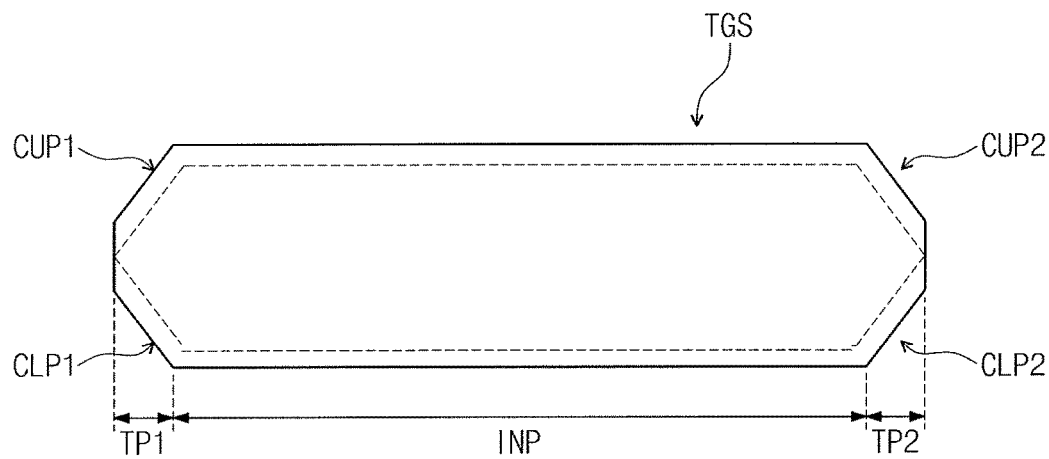
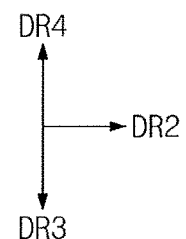
FIG. 14D
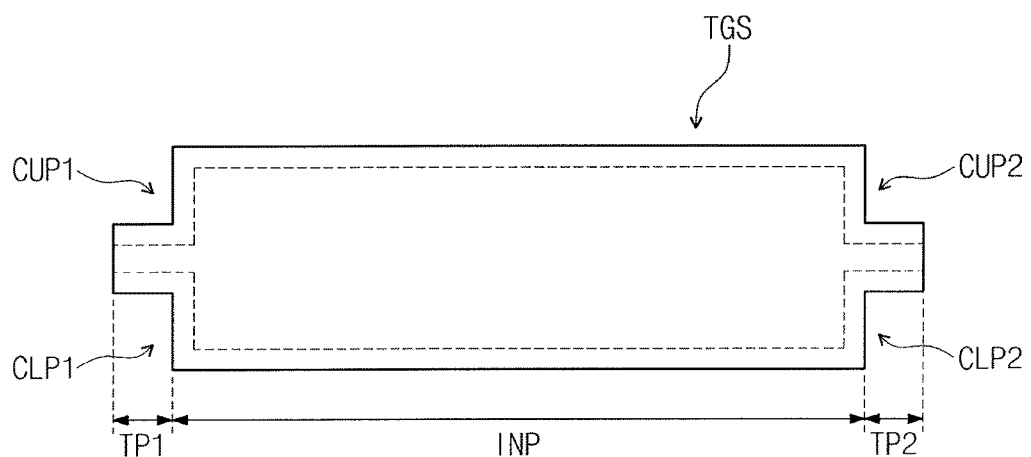
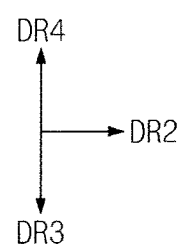

METHOD FOR FABRICATING REINFORCED GLASS SUBSTRATE, METHOD FOR FABRICATING DISPLAY DEVICE AND THE DISPLAY DEVICE

CROSS-REFERENCE TO RELATED APPLICATION

Korean Patent Application No. 10-2016-0038599, filed on Mar. 30, 2016, in the Korean Intellectual Property Office, and entitled: "Method for Fabricating Reinforced Glass Substrate, Method for Fabricating Display Device and the Display Device," is incorporated by reference herein in its entirety.

BACKGROUND

1. Field

Embodiments relate to a method for fabricating a reinforced glass substrate, a method for fabricating a display device, and a display device.

2. Description of the Related Art

In general, reinforced glass substrates are provided in display panels, touching sensing units, window members for a display device, and so on. In recent years, as interest in a display device having a thin thickness has increased, research directed to providing a glass substrate having uniform strength while having a thin thickness has been conducted.

SUMMARY

Embodiments are directed to a method for fabricating a reinforced glass substrate including forming a plurality of groove patterns in at least one surface of a plate glass, applying an ion exchange paste to the at least one surface in which the groove patterns are formed, applying an electric field to the plate glass coated with the ion exchange paste to form a reinforced plate glass, and cutting the reinforced plate glass to form a reinforced glass substrate.

Forming the groove patterns may be performed by applying laser or heat energy to the at least one surface.

Forming the groove patterns may include forming a plurality of first groove patterns that extend in a first direction and that are spaced apart from each other in a second direction crossing the first direction on a first surface of the plate glass.

Each of the first groove patterns may be formed to be concave when viewed from an upper side of the plate glass.

Forming the groove patterns may further include forming a plurality of second groove patterns on a second surface of the plate glass, the second surface being an opposite surface of the plate glass from the first surface.

Forming the second groove patterns may include forming the second groove patterns to extend in the first direction and to be spaced apart from each other in the second direction.

Each of the second groove patterns may be formed to be concave, when viewed from a lower side of the plate glass.

Each of the second groove patterns may be formed to overlap a respective one of the first groove patterns.

Applying the ion exchange paste may include applying the ion exchange paste to contact the first surface in which the first groove patterns are formed, thereby forming a first ion exchange paste layer and applying the ion exchange paste to contact the second surface in which the second groove patterns are formed, thereby forming a second ion exchange paste layer.

Forming the reinforced plate glass may include connecting the first ion exchange paste layer to a first electrode, connecting the second ion exchange paste layer to a second electrode, and applying a voltage to at least one of the first electrode and the second electrode.

The ion exchange paste as applied may contain $K^+$ ions.

Forming the reinforced glass substrate may include applying laser energy or a cutting wheel to cut the reinforced plate glass, thereby forming the reinforced glass substrate.

Forming the reinforced glass substrate may include cutting the reinforced plate glass along a cutting reference line that overlaps at least one of the groove patterns to form the reinforced glass substrate.

The reinforced glass substrate may include a tensile stress layer that receives a tensile stress, a first compressive stress layer that contacts one surface of the tensile stress layer to receive a compressive stress; and a second compressive stress layer that contacts another surface of the tensile stress layer to receive a compressive stress.

Forming the reinforced glass substrate may include forming the reinforced glass substrate to have at least one end having a thickness that is less than a thickness of a region adjacent to a center of gravity of the reinforced glass substrate.

The method may further include cleaning the reinforced plate glass.

Embodiments are also directed to a method for fabricating a display device including forming a plurality of groove patterns in at least one surface of a plate glass applying ion exchange paste to the at least one surface in which the groove patterns are formed, applying an electric field to the plate glass coated with the ion exchange paste to form a reinforced plate glass, cutting the reinforced plate glass to form a reinforced glass substrate, and forming a display device including the reinforced glass substrate.

Forming the display device may include at least one of forming a window member, forming a touch sensing unit, and forming a display panel.

Forming the groove patterns may be performed by applying laser or heat energy to the at least one surface.

Forming the reinforced glass substrate may include providing laser energy or a cutting wheel to cut the reinforced plate glass, thereby forming the reinforced glass substrate.

Embodiments are also directed to a display device including a display panel, and a window member on the display panel. At least one of the display panel and the window member includes a reinforced glass substrate. The reinforced glass substrate includes an intermediate portion adjacent to a center of gravity, a first terminal portion connected to the intermediate portion, the first terminal portion including a first concave pattern that is recessed with respect to an outer surface of the intermediate portion, and a second terminal portion connected to the intermediate portion and spaced apart from the first terminal portion, the second terminal portion including a second concave pattern that is recessed with respect to the outer surface of the intermediate portion.

The first concave pattern may include a first upper concave pattern in an upper portion of the first terminal portion and a first lower concave pattern in a lower portion of the first terminal portion.

The first concave pattern may have shape that constitutes a portion of a circle, a portion of an oval, a portion of a triangle, or a portion of a quadrangle in a cross-section.

The second concave pattern may include a second upper concave pattern in an upper portion of the second terminal portion and a second lower concave pattern in a lower portion of the second terminal portion.

The second concave pattern may have a shape that constitutes a portion of a circle, a portion of an oval, a portion of a triangle, or a portion of a quadrangle on a cross-section.

At least one of the first terminal portion and the second terminal portion may have a thickness that is less than the thickness of the intermediate portion.

Embodiments are also directed to a display device including a display panel, a touch sensing unit on the display panel, and a window member on the touch sensing unit. At least one of the display panel, the touch sensing unit, and the window member includes a reinforced plate substrate. The reinforced plate substrate includes a intermediate portion adjacent to a center of gravity of the reinforced plate substrate, a first terminal portion connected to the intermediate portion, the first terminal portion including a first concave pattern that is recessed with respect to an outer surface of the intermediate portion, and a second terminal portion connected to the intermediate portion and spaced apart from the first terminal portion, the second terminal portion including a second concave pattern that is recessed with respect to the outer surface of the intermediate portion.

BRIEF DESCRIPTION OF THE DRAWINGS

Features will become apparent to those of skill in the art by describing in detail exemplary embodiments with reference to the attached drawings in which:

FIG. 1 illustrates a flowchart sequentially depicting a method for fabricating a reinforced glass substrate according to an embodiment;

FIGS. 14A, 14B, 14C, and 14D illustrate schematic cross-sectional views of a reinforced glass substrate provided in the display device according to an embodiment.

DETAILED DESCRIPTION

Figure 2A:
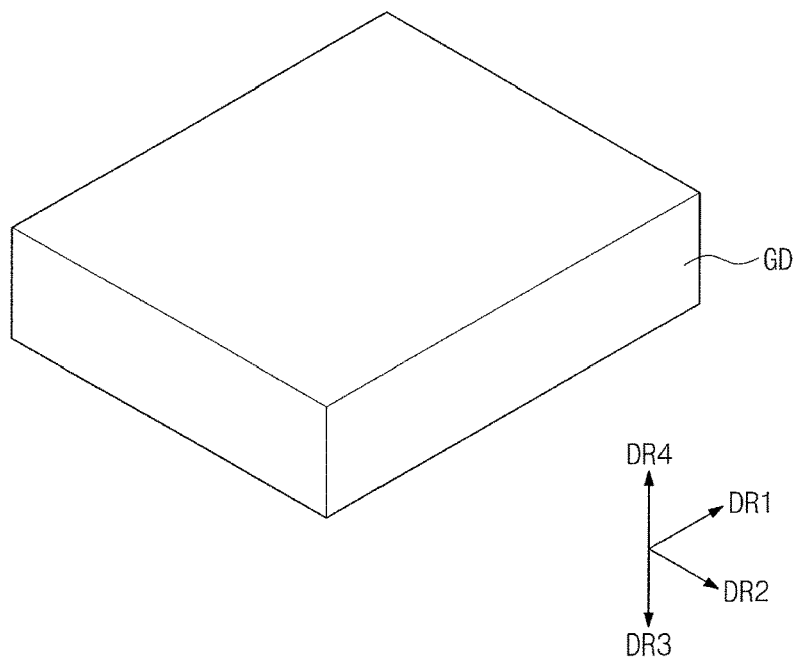
FIGS. 2A, 3A, 4A, 5A, 6A, 7A, and 8A illustrate perspective views sequentially depicting stages of the method for fabricating the reinforced glass substrate according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

FIG. 1 illustrates a flowchart sequentially depicting a method for fabricating a reinforced glass substrate according to an embodiment. FIGS. 2A, 3A, 4A, 5A, 6A, 7A, and 8A illustrate perspective views sequentially depicting stages of a method for fabricating the reinforced glass substrate according to an embodiment. FIGS. 2B, 3B, 4B, 5B, 6B, 7B, and 8B illustrate cross-sectional views sequentially depicting stages of the method for fabricating the reinforced glass substrate according to the embodiment.

Referring to FIGS. 1, 2A to 8A, and 2B to 8B, a method for fabricating a reinforced glass substrate display device TGS according to an embodiment includes a process (S100) of forming a plurality of groove patterns PT1 and PT2 in at least one surface of a plate glass GD, a process (S200) of applying an ion exchange paste to the surface in which the groove patterns PT1 and PT2 are formed, a process (S300) of applying an electric field to the plate glass GD coated with the ion exchange paste to form a reinforced plate glass TGD, and a process (S400) of cutting the reinforced plate glass TGD to form the reinforced glass substrate TGS.

Figure 2B:
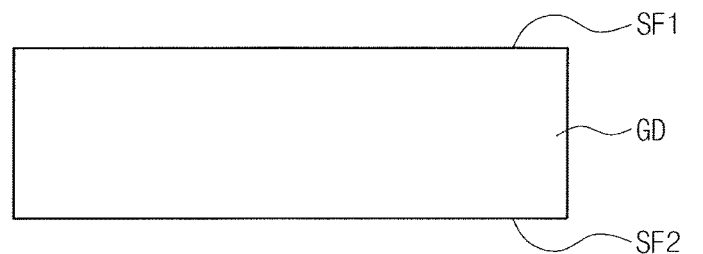
FIGS. 2B, 3B, 4B, 5B, 6B, 7B, and 8B illustrate cross-sectional views sequentially depicting stages of the method for fabricating the reinforced glass substrate according to an embodiment.

Referring to FIGS. 1, 2A, 2B, the plate glass GD is prepared. The plate glass GD may represent glass having a plate shape before cutting, which may have difficulty in use.

Referring to FIG. 1, 3A, 3B, 4A, 4B, the process (S100) of forming the groove patterns PT1 and PT2 may include a process of forming a plurality of first groove patterns PT1 to extend in a first direction DR1 and to be spaced apart from each other in a second direction DR2 crossing the first direction DR1, on a first surface SF1 of the plate glass GD. The process (S100) of forming the groove patterns PT1 and PT2 may include a process of forming a plurality of second groove patterns PT2 on a second surface SF2, the second surface SF2 being an opposite side of the plate glass GD from the first surface SF1.

Figure 3A:
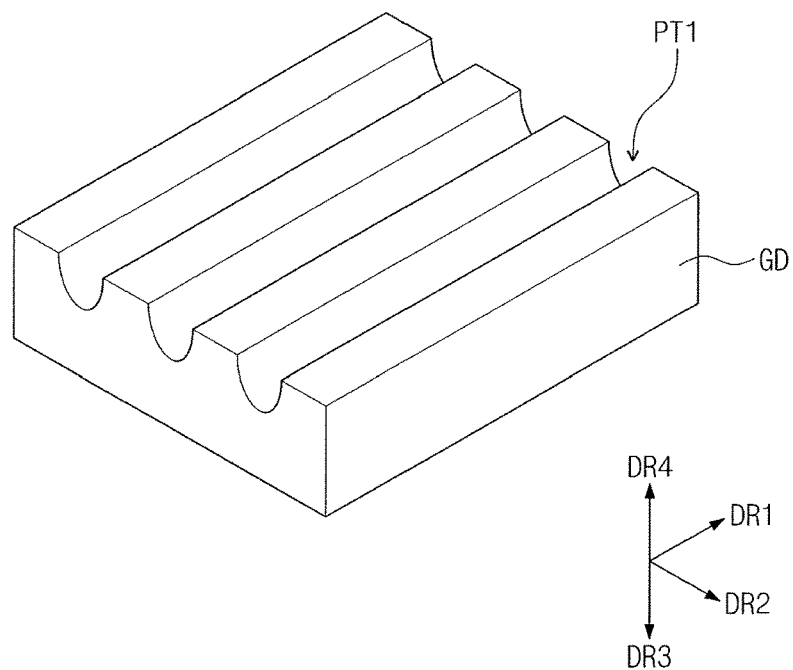
Figure 3B:
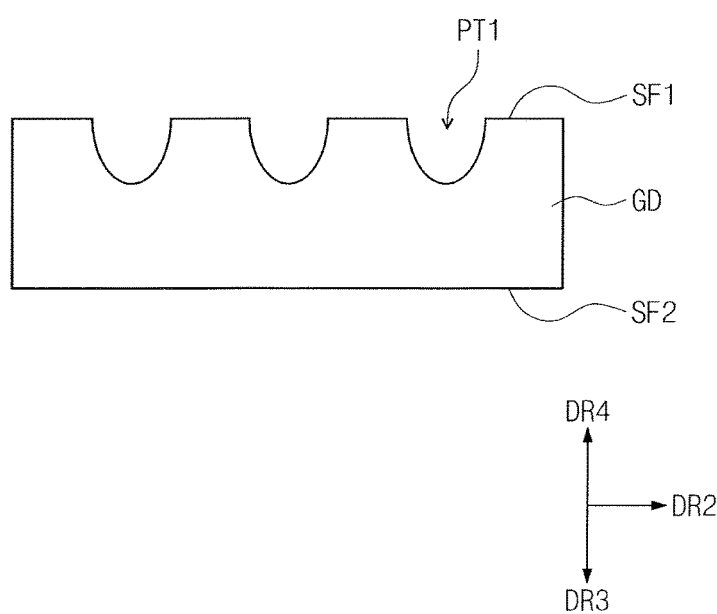

Referring to FIGS. 1, 3A, and 3B, the plurality of first groove patterns PT1 may be formed on the first surface SF1 of the plate glass GD (S100). For example, the first surface SF1 may be a top surface of the plate glass GD. The process (S100) of forming the first groove patterns PT1 may be formed, for example by providing laser or heat energy to the first surface SF1.

The first groove patterns PT1 may extend in the first direction DR1 and be spaced apart from each other in the second direction DR2 crossing the first direction DR1. The first groove patterns PT1 may have same distances therebetween, as illustrated in FIGS. 3A and 3B. In some implementations, at least one of distances between the first groove patterns PT1 may be different.

The first groove patterns PT1 may be recessed from the first surface SF1. When viewed from an upper side (for example, a third direction DR3), the first groove patterns PT1 may be concave. Each of the first groove patterns PT1 may have a shape that constitutes a portion of a circle or oval, as illustrated in FIGS. 3A and 3B. In some implementations, the first groove patterns PT1 may have various other shapes, such as shapes that constitute a portion of a triangle, or a portion of a quadrangle in a cross-section.

Figure 4A:
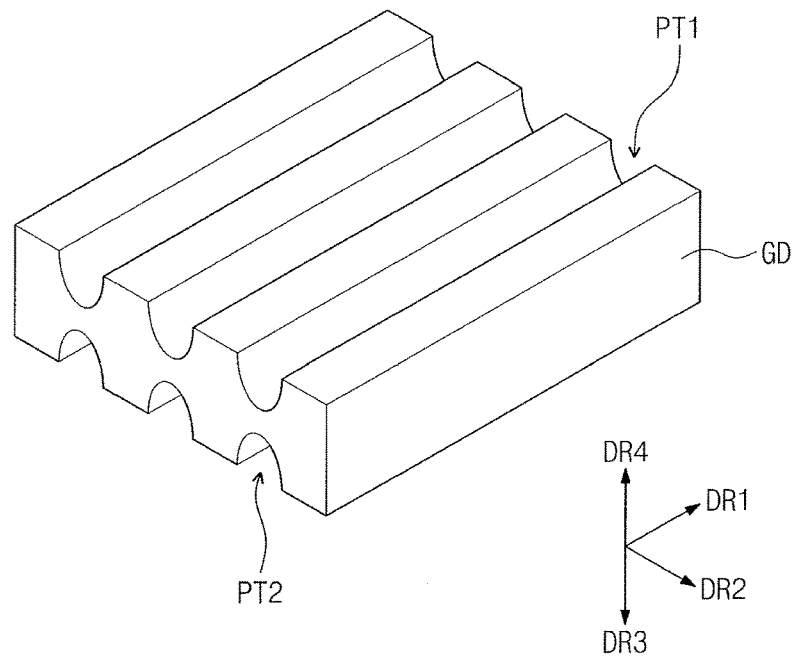
Figure 4B:
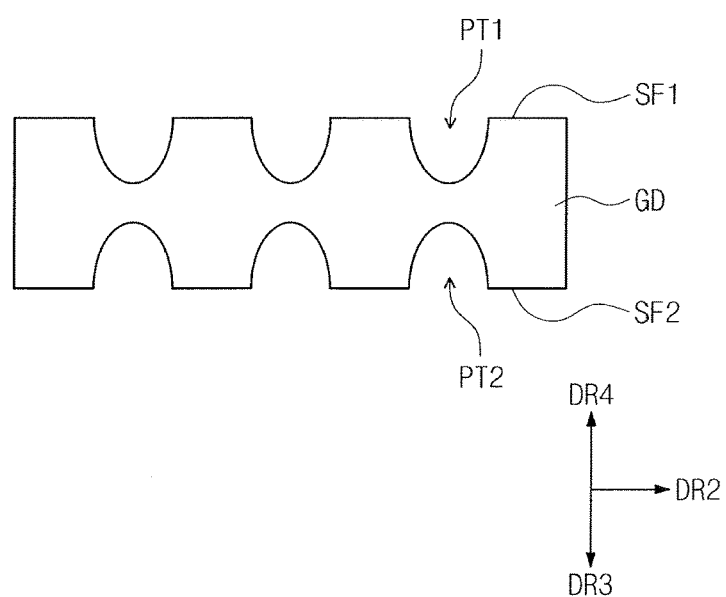

Referring FIGS. 1, 4A, and 4B, the method for fabricating the reinforced glass substrate TGS according to an embodiment may further include the process of forming the plurality of second groove patterns PT2 on the second surface SF2, which faces the first surface SF1, on an opposite side of the plate glass GD. For example, the second surface SF2 may be a bottom surface of the plate glass GD. The process of forming the second groove patterns PT2 may include, for example, the second groove patterns PT2 providing laser or heat energy to the second surface SF2.

The second groove patterns PT2 may extend in the first direction DR1 and may be spaced apart from each other in the second direction DR2 crossing the first direction DR1. The second groove patterns PT2 may have the same distances therebetween, as illustrated in FIGS. 4A and 4B. In some implementations, at least one of distances between the second groove patterns PT2 may be different.

The second groove patterns PT2 may be recessed from the second surface SF2.

When viewed from a lower side (for example, a fourth direction DR4), the second groove patterns PT2 may be concave. When viewed from an upper side (for example, the third direction DR3), the second groove patterns PT2 may be convex. Each of the second groove patterns PT2 may have a shape that constitutes a portion of a circle or oval as shown in FIGS. 4A and 4B. In some implementations, the second groove patterns PT2 may have various other shapes such as shapes that respectively constitute a portion of a triangle, or a portion of a quadrangle on a cross-section.

The second groove patterns PT2 may overlap the first groove patterns PT1. One second groove pattern may overlap a corresponding one of the first groove patterns, as illustrated in FIGS. 4A and 4B. In some implementations one second groove pattern may overlap a portion of one first groove pattern.

Figure 5A:
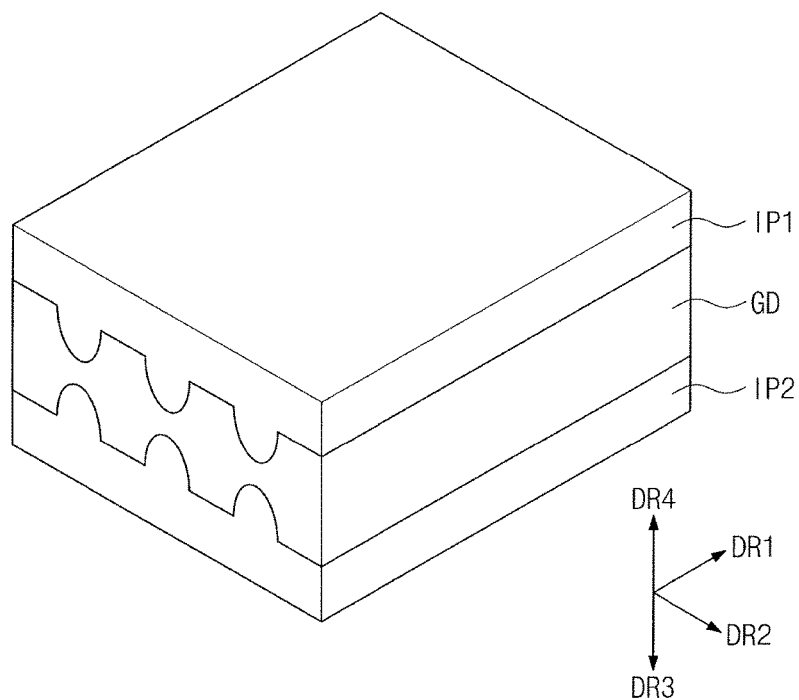
Figure 5B:
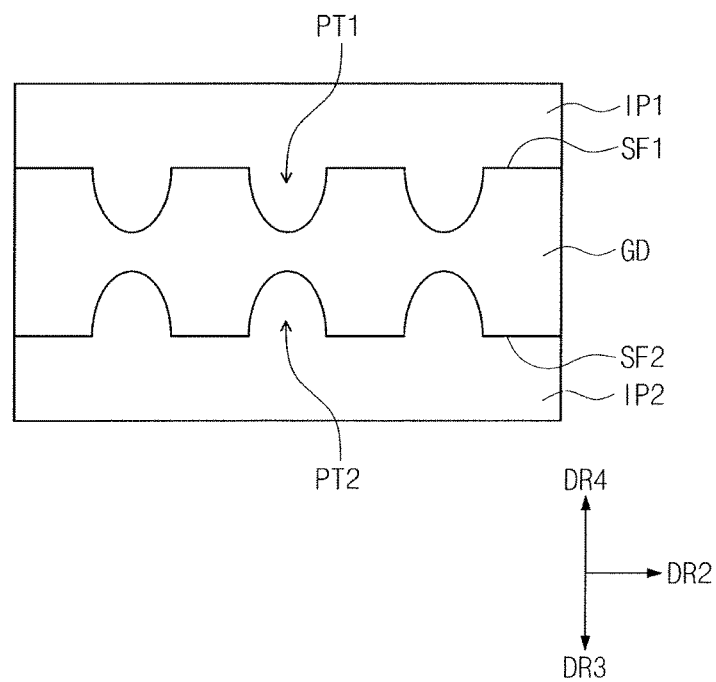

Referring to FIGS. 1, 5A, and 5B, the ion exchange paste may be applied to one surface in which the groove patterns PT1 and PT2 are formed (S200). The ion exchange paste may contain ions of K. The process (S200) of applying the ion exchange paste may include a process of applying the ion exchange paste to the first surface to form a first ion exchange paste layer IP1. The process (S200) of applying the ion exchange paste may further include a process of applying the ion exchange paste to a bottom surface of the second surface SF2 in which the second groove patterns PT2 are formed. The ion exchange paste may be applied to the bottom surface of the second surface SF2 to form a second ion exchange layer IP2.

Figure 6A:
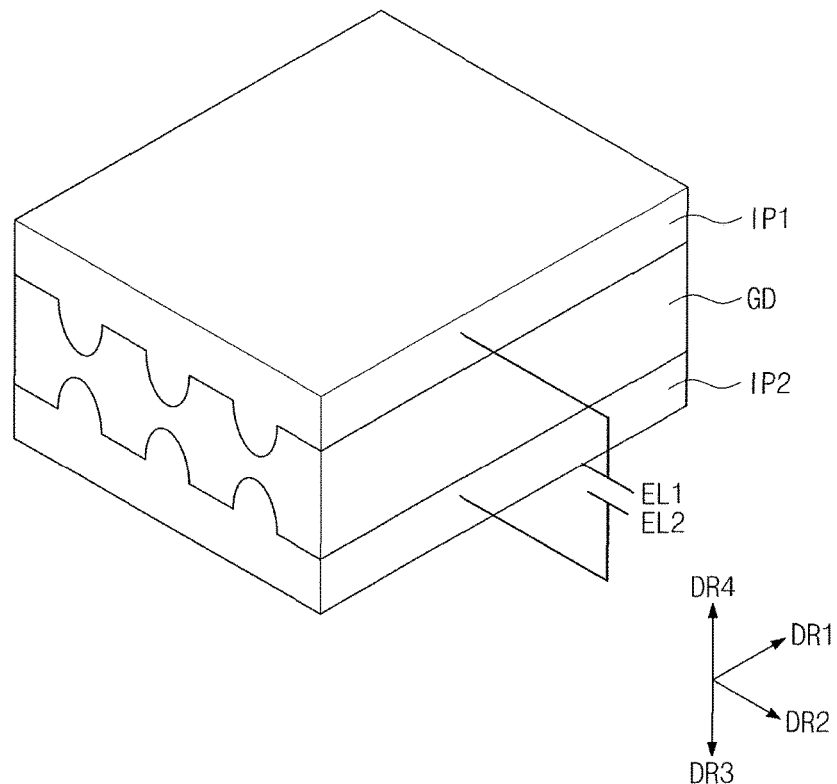
Figure 6B:
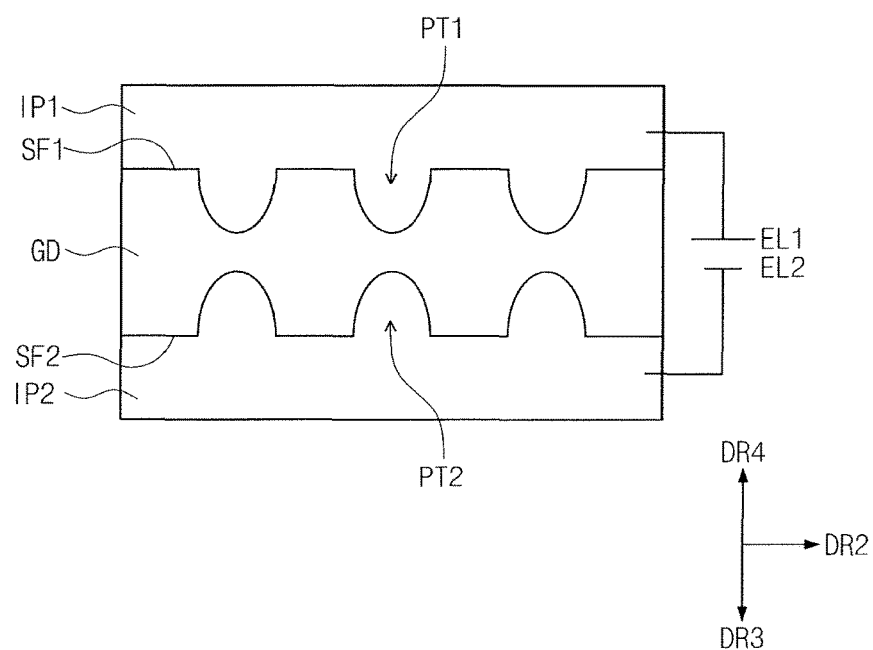

Referring to FIGS. 1, 6A, and 6B, an electric field may be applied to the plate glass GD coated with the ion exchange paste to form the reinforced plate glass (see reference symbol TGD of FIG. 7A) (S300). The first ion exchange paste layer IP1 may be connected to a first electrode EL1. The second ion exchange paste layer IP2 may be connected to a second electrode EL2. A voltage may be applied to at least one of the first and second electrodes EL1 and EL2 to generate an electric field between the first and second electrodes EL1 and EL2. When the electric field is applied to the plate glass GD coated with the ion exchange paste, ions of $Na^+$ in the surface of the plate glass GD may be removed. Then, ions of $K^+$ may be injected to be substituted to form the reinforced plate glass (see reference symbol TGD of FIG. 7A).

Figure 7A:
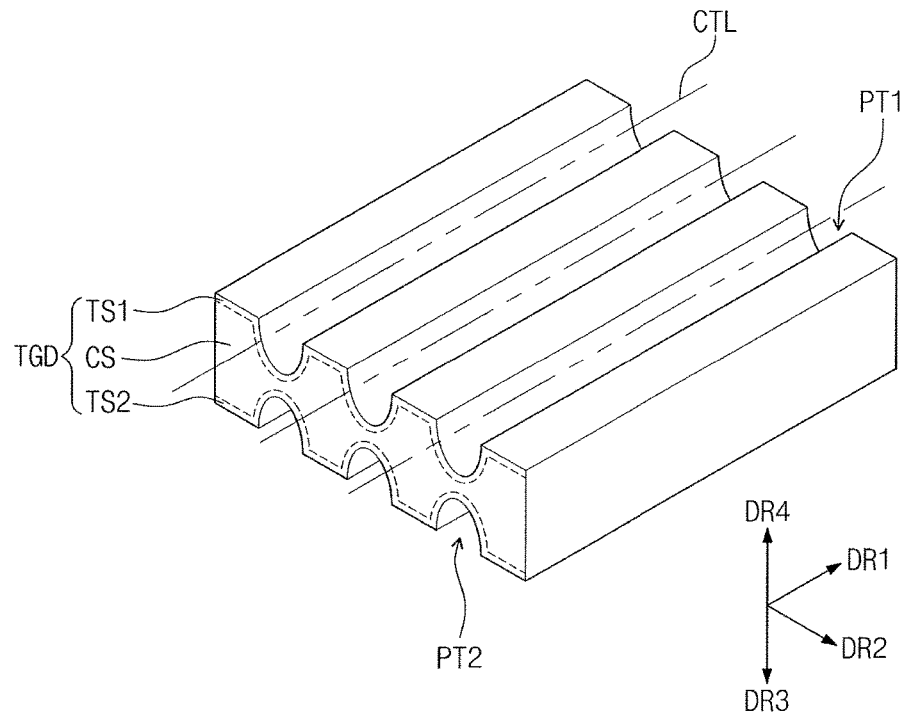
Figure 7B:
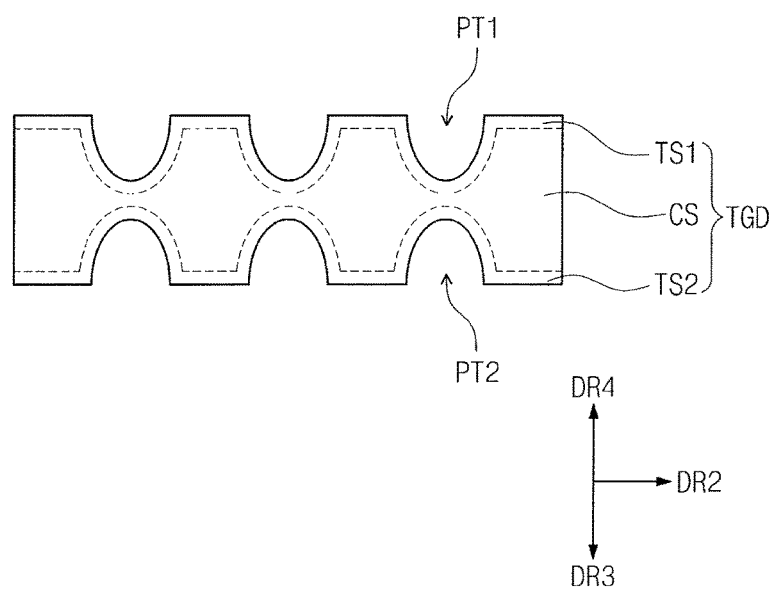
Figure 8A:
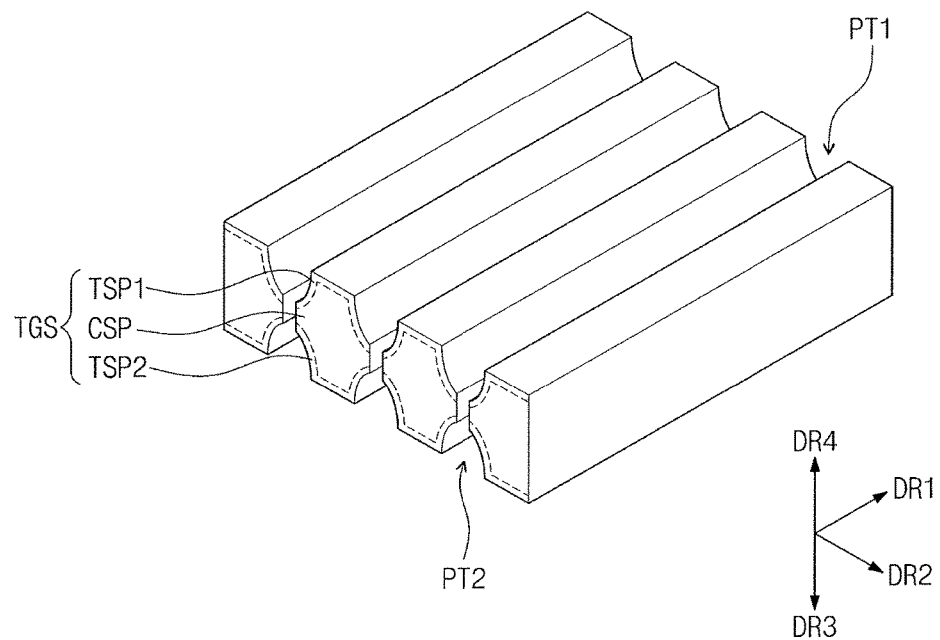
Figure 8B:
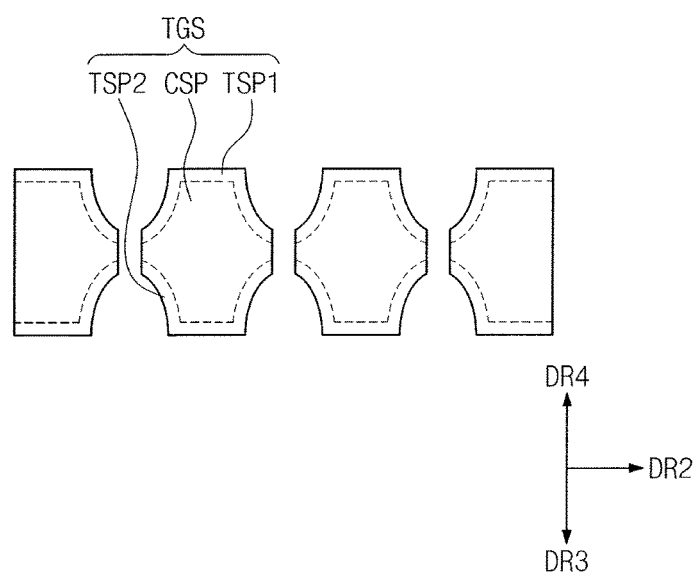

Referring to FIGS. 1, 7A, and 7B, the reinforced plate glass TGD formed by applying the electric field may receive a compressive stress in upper and lower portions of the reinforced plate glass TGD and may receive a tensile stress in the inner portion of the reinforced plate glass TGD. When the ions of $Na^+$ are removed through the surface of the reinforced plate glass TGD, the reinforced plate glass TGD may expand. After the ions of K+ are injected to be substituted, the reinforced plate glass TGD may contract to generate the compressive stress in upper and lower portions of the reinforced plate glass TGD and to generate the tensile stress in the inner portion of the reinforced plate glass TGD.

For example, the reinforced plate glass TGD may include a tensile stress layer CS, a first compressive stress layer TS1, and a second compressive stress layer TS2. The first compressive stress layer TS1 may be located on a top surface of the tensile stress layer CS. The second compressive stress layer TS2 may be located on a bottom surface of the tensile stress layer CS. Each of the first and second compressive stress layers TS1 and TS2 may be located on the surfaces of the reinforced plate glass TGD. The tensile stress layer may be located within the reinforced plate glass TGD.

The method for fabricating the reinforced glass substrate TGS according to an embodiment may further include a process of cleaning the reinforced plate glass TGD. In the process of cleaning the reinforced plate glass TGD, the first ion exchange paste layer (see reference symbol IP1 of FIG. 6A), foreign substances, contaminants, and glass particles existing on the first surface SF1 of the reinforced plate glass TGD may be removed. In the process of cleaning the reinforced plate glass TGD, the second ion exchange paste layer (see reference symbol IP2 of FIG. 6A), foreign substances, contaminants, and glass particles on the second surface SF2 of the reinforced plate glass TGD may be removed.

Referring to FIGS. 1, 7A, 7B, 8A, and 8B, the reinforced plate glass TGD may be cut to form the reinforced glass substrate TGS in (S400). The reinforced plate glass TGD may be cut by applying laser energy or a cutting wheel to form the reinforced glass substrate TGS, as examples.

In the process (S400) of forming the reinforced plate substrate TGS, the reinforced plate glass substrate TGD may be cut with respect to a cutting reference line CTL overlapping at least one of the groove patterns PT1 and PT2 to form the reinforced glass substrate TGS. When the reinforced plate glass TGD is cut with respect to one first groove pattern, a first upper concave pattern (see reference symbol CUP1 of FIG. 14A) and a second upper concave pattern (see reference symbol CUP2 of FIG. 14A), which are provided in the reinforced plate substrate TGS, may be formed. The reinforced plate glass TGD may be cut with respect to one second groove pattern, and a first lower concave pattern (see reference symbol CLP1 of FIG. 14A) and a second lower concave pattern (see reference symbol CLP2 of FIG. 14A), which are provided in the reinforced plate substrate, may be formed.

The reinforced glass substrate may receive a compressive stress in upper and lower portions of the reinforced plate glass TGD and may receive a tensile stress in the inner portion of the reinforced plate glass TGD. For example, the reinforced glass substrate TGS may include a tensile stress layer CSP, a first compressive stress layer TSP1, and a second compressive stress layer TS2. The first compressive stress layer TSP1 may be located on a top surface of the tensile stress layer CSP. The second compressive stress layer TSP2 may be located on a bottom surface of the tensile stress layer CSP. Each of the first and second compressive stress layers TSP1 and TSP2 may be located in upper and lower portions of the reinforced glass substrate TGS. The tensile stress layer CSP may be located in the reinforced glass substrate TGS.

The formed reinforced glass substrate TGS may be used for at least one of a window member WD, a touch sensing unit TSU, and a display panel DP, as will be described below.

In the process (S400) of forming the reinforced plate glass TGS, the reinforced plate glass TGS may have at least one end that has a thickness less than that of a portion thereof adjacent to a center of gravity of the reinforced glass substrate TGS.

Hereinafter, a method for fabricating the display device according to an embodiment and the display device according to an embodiment will be described. Hereinafter, different various aspects of the method for fabricating the reinforced glass according to the foregoing embodiment will be emphasized, and not all descriptions regarding the method for fabricating the reinforced glass according to the foregoing embodiment will be repeated.

Figure 9:
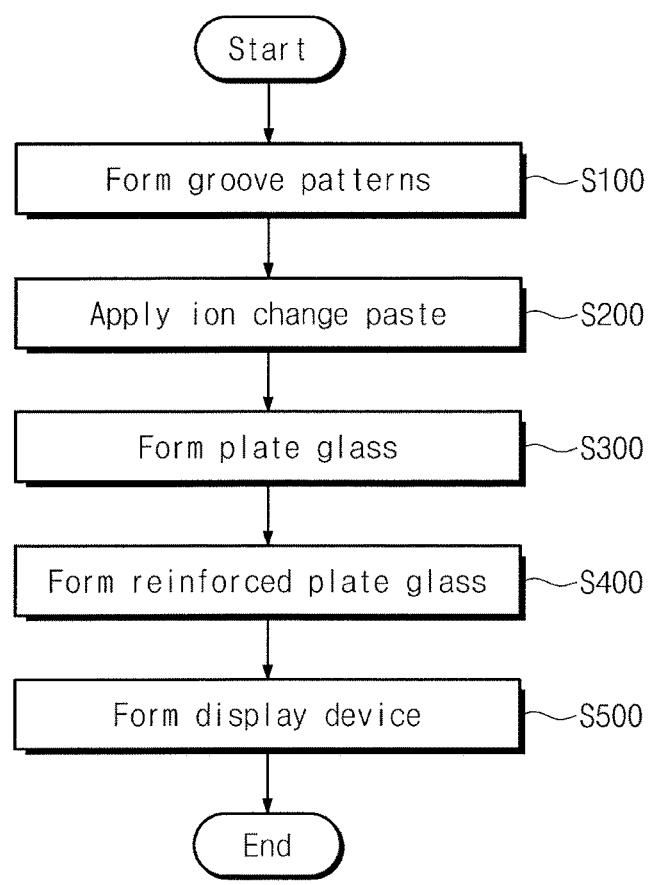
FIG. 9 illustrates a flowchart sequentially depicting the method of fabricating the display device according to an embodiment.
Figure 10A:
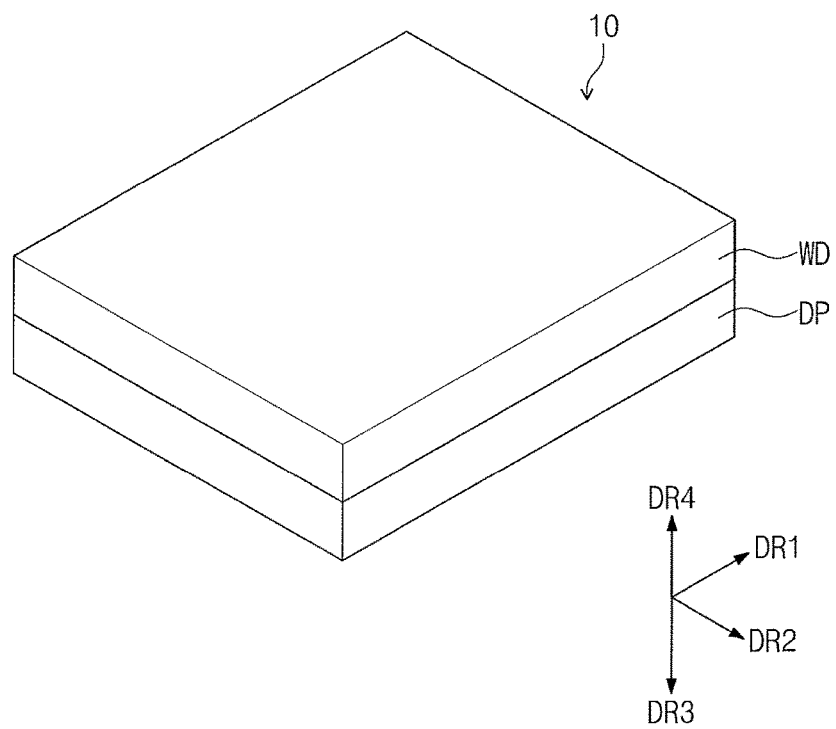
FIGS. 10A and 10B illustrate schematic perspective views of the display device according to an embodiment.
Figure 10B:
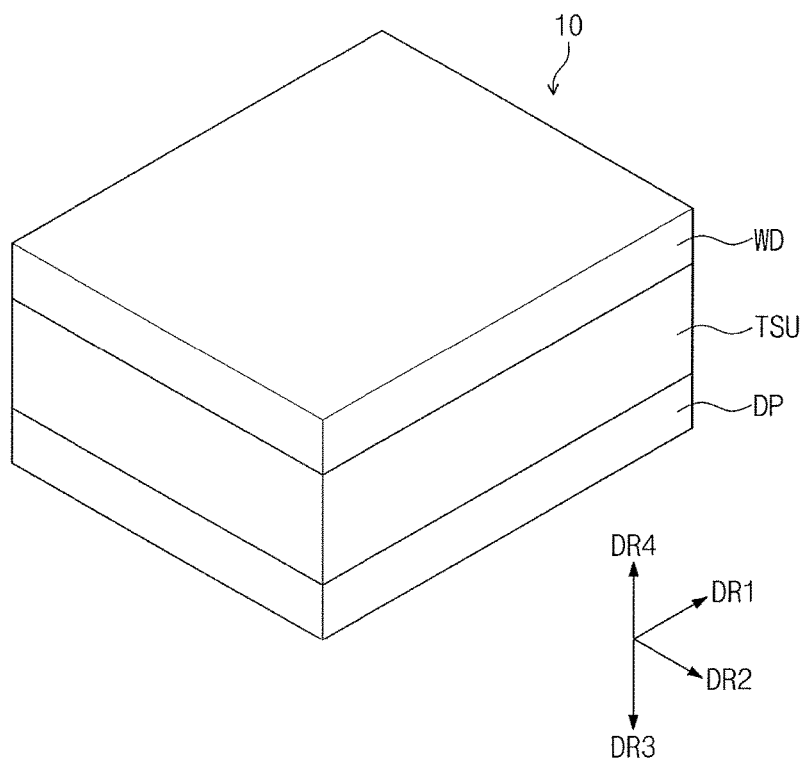

FIG. 9 illustrates a flowchart sequentially depicting a method of fabricating the display device according to an embodiment. FIGS. 10A and 10B illustrate schematic perspective views of the display device according to an embodiment.

Referring to FIGS. 1, 2A to 8A, 2B to 8B, 9, 10A, and 10B, the method of fabricating the display device 10 according to an embodiment may include the process (S100) of forming the plurality of groove patterns PT1 and PT2 in the at least one surface of the plate glass (GD), the process (S200) of applying the ion exchange paste to the surface in which the groove patterns PT1 and PT2 are formed, the process (S300) of applying the electric field to the plate glass coated with the ion exchange paste to form the reinforced plate glass TGD, the process (S400) of cutting the reinforced plate glass TGD to form the reinforced glass substrate TGS, and a process (S500) of providing the reinforced glass substrate TGS to form the display device 10. The process (S100) of forming the plurality of groove patterns PT1 and PT2 in the at least one surface of the plate glass GD, the process (S200) of applying the ion exchange paste to the surface in which the groove patterns are formed, the process (S300) of applying the electric field to the plate glass coated with the ion exchange paste to form the reinforced plate glass TGD, and the process (S400) of cutting the reinforced plate glass TGD to form the reinforced glass substrate TGS may be the same as the processes explained in the method for fabricating the reinforced glass substrate TGS. The process S500 of providing the reinforced glass substrate TGS to form the display device 10 will be described below in detail.

The display device 10 formed in the process (S500) of forming the display device 10 may be a portable display device such as a smart phone, or a medium-to-large display devices such as a television, a laptop computer, and a monitor. The process (S500) of forming the display device 10 may include at least one of a process of forming a window member WD, a process of forming a touch sensing unit TSU, and a process of forming a display panel DP. A display device 10 including all of the window member WD and the display panel DP is illustrated in FIG. 10A, and A display device 10 including all of the window member WD, the touch sensing unit TSU, and the display panel DP is illustrated in FIG. 10B. In some implementations, the window member WD or the display panel DP may be omitted in FIG. 10A, or at least one of the window member WD, the touch sensing unit TSU, and the display panel DP may be omitted in FIG. 10B.

Hereinafter, as illustrated in FIGS. 11, 12A, 12B, and 13, each of a reinforced glass substrate TGS provided in a display panel DP, a reinforced glass substrate TGS provided in a touch sensing unit TSU, and a reinforced glass substrate TGS provided in a window member WD will be explained. The reinforced plate substrate TGS will be explained below in detail with reference to FIGS. 14A, 14B, 14C, and 14D.

Figure 11:
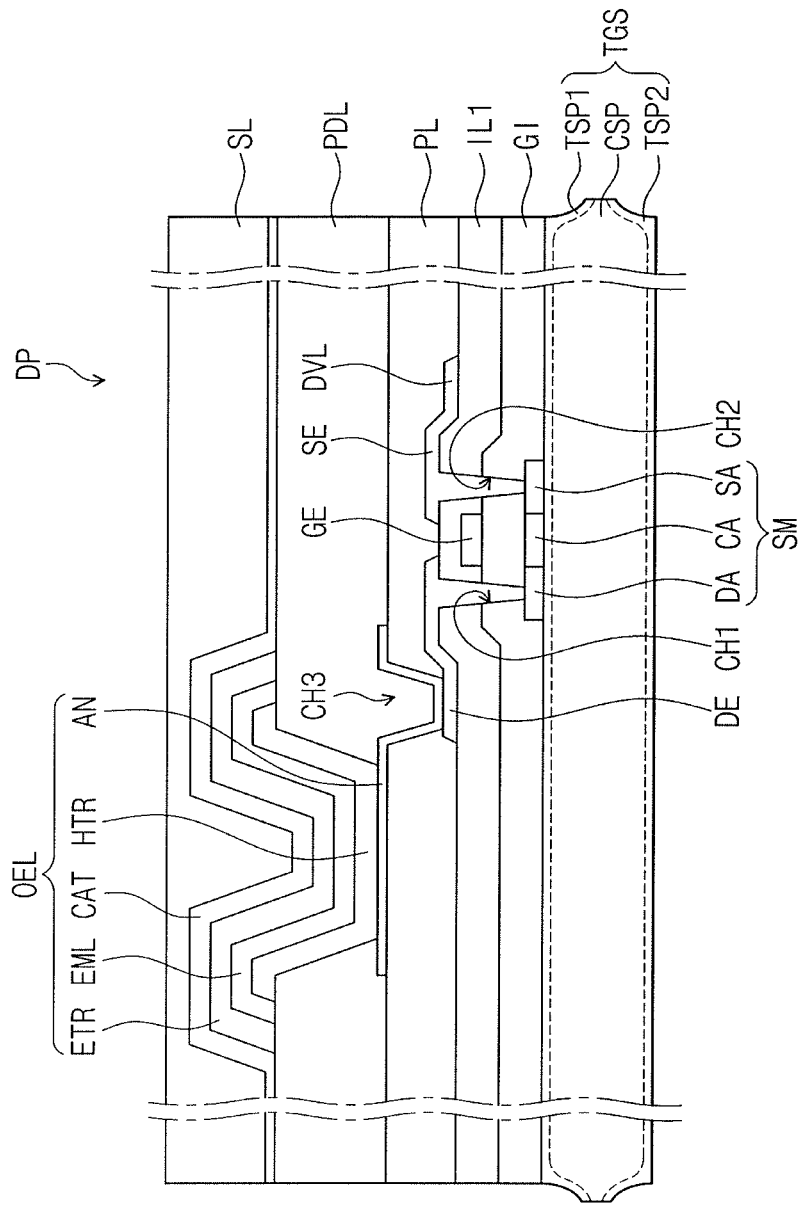
FIG. 11 illustrates a schematic cross-sectional view of a display panel provided in the display device according to an embodiment.

FIG. 11 illustrates a schematic cross-sectional view of a display panel provided in the display device according to an embodiment.

Referring FIGS. 10A, 10B, and 11, the display panel DP displays an image. The display panel DP may be flexible. The term "flexible" may refer to a characteristic capable of being curved. For example, the term "flexible" may apply to a full range of structures from a fully foldable structure to a structure that is cuttable and bendable to a degree of several nanometers.

For example, the display panel DP may be an organic light emitting display panel, a liquid crystal display panel, a plasma display panel, an electrophoretic display panel, a microelectromechanical system (MEMS) display panel, or an electrowetting display panel. In FIG. 11, the organic light emitting display panel is described as an example of the display panel DP.

Referring FIGS. 10 and 11, the display panel DP may include pixels. Each of the pixels may be connected to a wiring part including a gate line, a data line, and a driving voltage line DVL. Each of the pixels may include a thin film transistor connected to the wiring part, an organic electro luminescent device connected to the thin film transistor, and capacitor. Each of the pixels may emit light having a specific color, for example, one of red light, green light, blue light, white light, yellow light, and cyan light.

The display panel DP may include the reinforced glass substrate TGS, a thin film transistor, and an organic elector luminescent device OEL. The reinforced glass substrate TGS may receive a compressive stress in upper and lower portions and a tensile stress in the inner portion. For example, the reinforced glass substrate TGS may include a tensile stress layer CSP, a first compressive stress layer TSP1, and a second compressive stress layer TS2.

A semiconductor layer SM may be disposed on the reinforced glass substrate TGS. A gate insulation layer GI may be disposed on the semiconductor layer SM. A gate electrode GE is disposed on the gate insulation layer GI. A source electrode SE and a drain electrode DE may be disposed on an interlayer insulation layer ILL The drain electrode DE may contact a drain area DA of the semiconductor layer SM through a contact hole CH1 defined in the gate insulation layer GI and the interlayer insulation layer IL1, and the source drain SE may contact a source area SA of the semiconductor layer SM through a second contact hole CH2 defined in the gate insulation layer GI and the interlayer insulation layer IL1.

A passivation layer PL may be disposed on the source electrode SE and the drain electrode DE. The organic electro luminescent device OEL may be disposed on the passivation layer PL. The organic elector luminescent device OEL may include an anode AN, a hole transfer region HTR, a light emitting layer EML, an electron transfer region ETR, and a cathode CAT.

The anode AN may be, for example, a pixel electrode or a positive electrode. The anode AN may be connected to the drain electrode DE through a third contact hole CH3 defined in the passivation layer PL. The hole transport region HTR may be disposed on the anode AN. The hole transport region HTR may include at least one of a hole injection layer, a hole transport layer, a buffer layer, and an electron stop layer. The light emitting layer EML may be disposed on the hole transport region HTR. The electron transport region ETR may be disposed on the light emitting layer EML. The electron transport region ETR may include at least one of a hole stop layer, an electron transport layer, and an electron injection layer. The cathode CAT may be disposed on the electron transport region ETR. The cathode CAT may be a common electrode or a negative electrode.

An encapsulation layer SL may be disposed on the cathode CAT. The encapsulation layer SL may be, for example, a thin film encapsulation layer. The encapsulation layer SL may protect the organic electro luminescent device OEL.

Figure 12A:
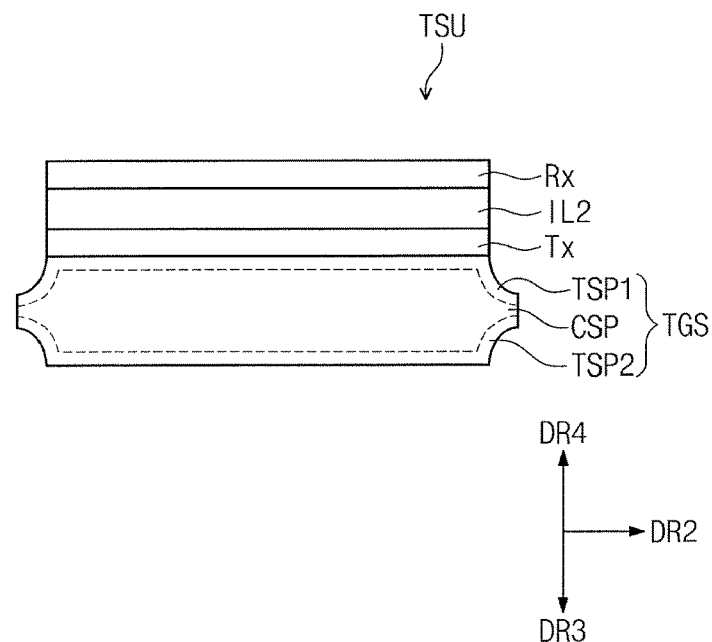
FIGS. 12A and 12B illustrate schematic perspective views of a touch sensing unit provided in the display device according to an embodiment.
Figure 12B:
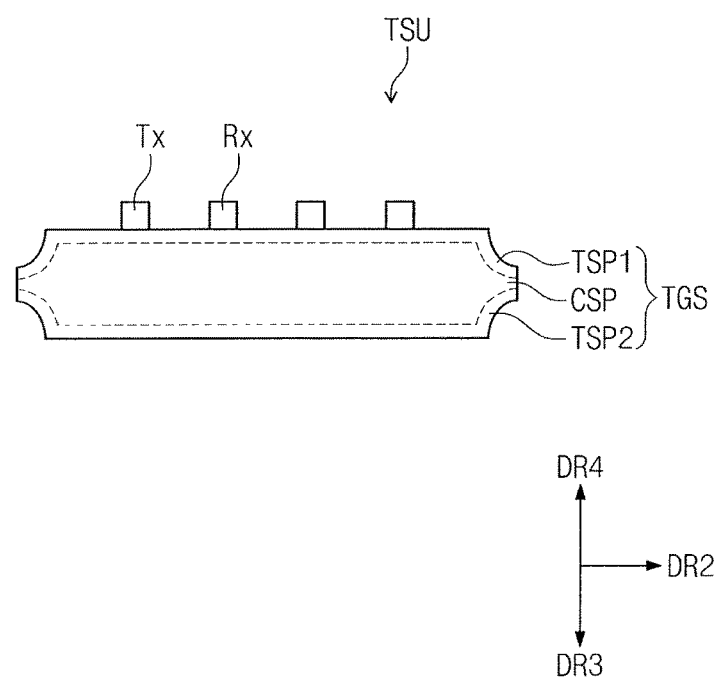

FIGS. 12A and 12B are schematic cross-sectional views of a touch sensing unit provided in the display device according to an embodiment.

Referring FIGS. 10B, 12A, and 12B, the touching sensing unit TSU may be disposed on the display panel DP. The touch sensing unit TSU may be connected to the display panel through an adhesion layer. In some implementations, the touch sensing unit TSU may be continuously disposed on a portion of components of the display panel DP, e.g., the encapsulation layer (see reference symbol SL of FIG. 11) without using the adhesion layer. The touch sensing unit TSU may include the reinforced glass substrate TGS, first detection electrodes Tx, and second detection electrodes Rx. The reinforced glass substrate TGS may receive a compressive stress in upper and lower portions and tensile stress in the inner portion. For example, the reinforced glass substrate TGS includes a tensile stress layer CSP, a first compressive stress layer TSP1, and a second compressive stress layer TS2.

The touch sensing unit TSU may recognize a direct touch of a user or an indirect touch of the user, and/or a direct touch of an object or an indirect touch of the object. The term "indirect touch" may refer to a capability of the touch sensing unit TSU to recognize the touch of the user or the object even though the user or the object does not directly touch the touch sensing unit TSU.

When the direct touch or the indirect touch occurs, a variation in capacitance between the first detection electrodes Tx and the second detection electrodes Rx occurs. A sensing signal applied to the first detection electrodes Tx may be delayed and transmitted to the second detection electrodes Rx according to the variation in capacitance. The touch sensing unit TSU may sense touch coordinates from the delay value of the detection signal.

Referring to FIGS. 10B and 12A, the first electrodes Tx and the second electrodes Rx may be disposed on layers different from each other. For example, the first electrodes Tx may be disposed on the reinforced glass substrate TGS, and the insulation layer IL2 may be disposed on the first electrodes Tx. The second electrodes Rx may be disposed on the first electrodes Tx.

Referring to FIGS. 10B and 12B, the first electrodes Tx and the second electrodes Rx may be disposed on the same layer. Each of the first electrodes Tx and the second electrodes Rx may be disposed on the reinforced glass substrate TGS.

The touch sensing unit TSU including the reinforced glass substrate TGS is described as an example, as illustrated in FIGS. 10B, 12A, and 12B. In other implementations, when the window member WD or the display panel DP includes the reinforced glass substrate TGS, the touch sensing unit TSU may not include the reinforced glass substrate TGS. For example, the first electrodes Tx may be provided on the encapsulation layer (see reference symbol SL of FIG. 13) of the display panel DP in FIG. 12A. In some implementations, the first and second electrodes Tx and Rx may be disposed on the encapsulation layer (see reference symbol SL of FIG. 11) of the display panel DP.

Figure 13:
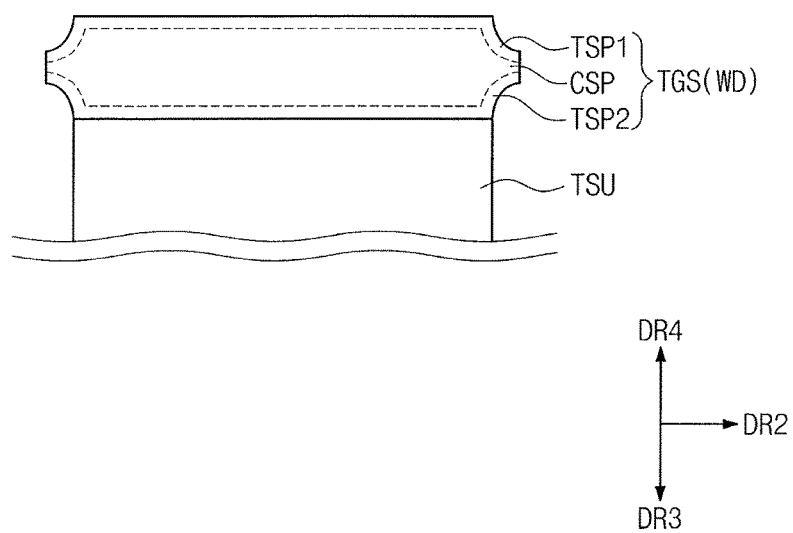
FIG. 13 illustrates a schematic cross-sectional view of a window member provided in the display device according to an embodiment.

FIG. 13 illustrates a schematic cross-sectional view of a window member provided in the display device according to an embodiment.

Referring to FIGS. 10A, 10B, and 13, the window member WD may be disposed on the touch sensing unit TSU. The window member WD may be disposed at the uppermost portion of the display device 10. The reinforced glass substrate TGS may be used as a cover glass provided in the window member WD. The reinforced glass substrate TGS may receive a compressive stress in upper and lower portions and tensile stress in the inner portion. For example, the reinforced glass substrate TGS includes a tensile stress layer CSP, a first compressive stress layer TSP1, and a second compressive stress layer TS2.

FIGS. 14A, 14B, 14C, and 14D illustrate schematic cross-sectional views of the reinforced glass substrate according to an embodiment.

Referring FIGS. 10A to 13 and 14A, the display device 10 according to an embodiment may include the display panel DP and the window member WD as described above. The display device 10 according to an embodiment may include the display panel 10, the touch sensing unit TSU, and the window member WD.

At least one of the display panel DP and the window member WD may include the reinforced glass substrate TGS. At least one of the display panel DP, the touch sensing unit TSU, and the window member WD may include the reinforced glass substrate TGS.

Figure 14A:
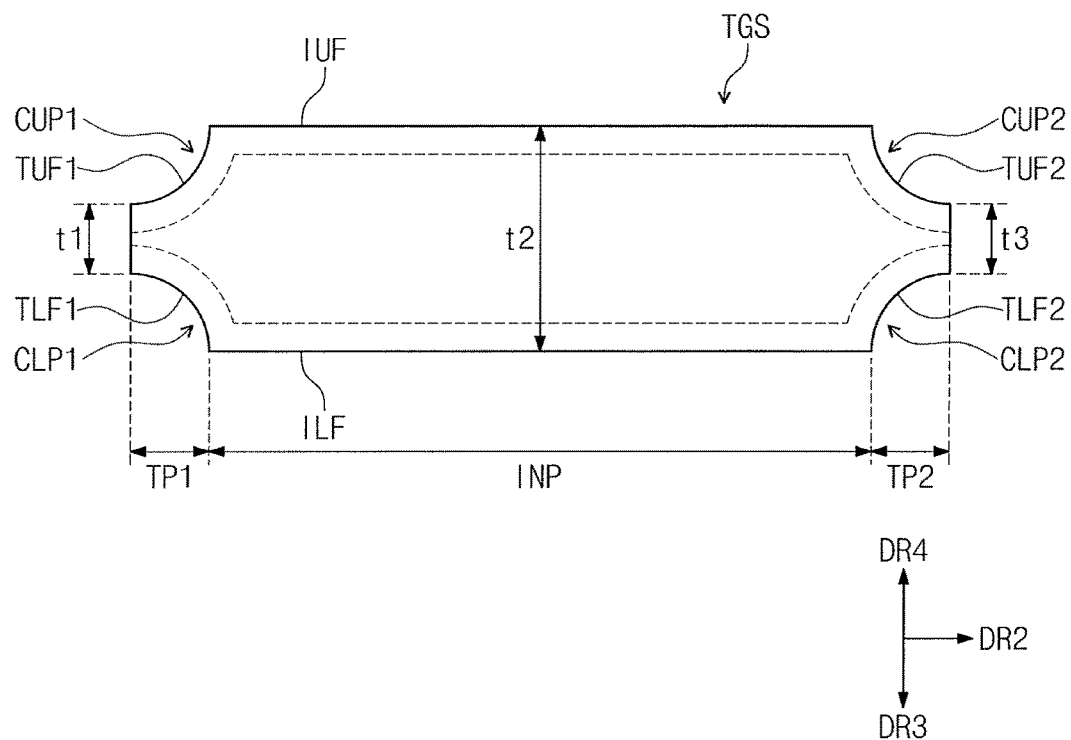

Referring to FIG. 14A, the reinforced glass substrate TGS may include an intermediate portion INP, a first terminal portion TP1, and a second terminal portion TP2. The intermediate portion INP, the first terminal portion TP1, and the second terminal portion TP2 may be connected to each other and thus may be provided as one body. At least one of a thickness t1 of the first terminal portion TP1 and a thickness t3 of the second terminal portion TP2 may be less than a thickness t2 of the intermediate portion INP.

The intermediate portion INP may be provided adjacent to the center of gravity of the reinforced glass substrate TGS. The intermediate portion INP may have side surfaces connected to the first terminal portion TP1 and the second terminal portion TP2. The side surfaces of the intermediate portion INP may not be exposed to the outside. The intermediate portion INP may include a tensile stress layer, a first compressive stress layer, and a second compressive stress layer. The first compressive stress layer may be disposed on a top surface of the tensile stress layer. The second compressive stress layer may be disposed on the bottom surface of the tensile stress layer.

Figure 14B:
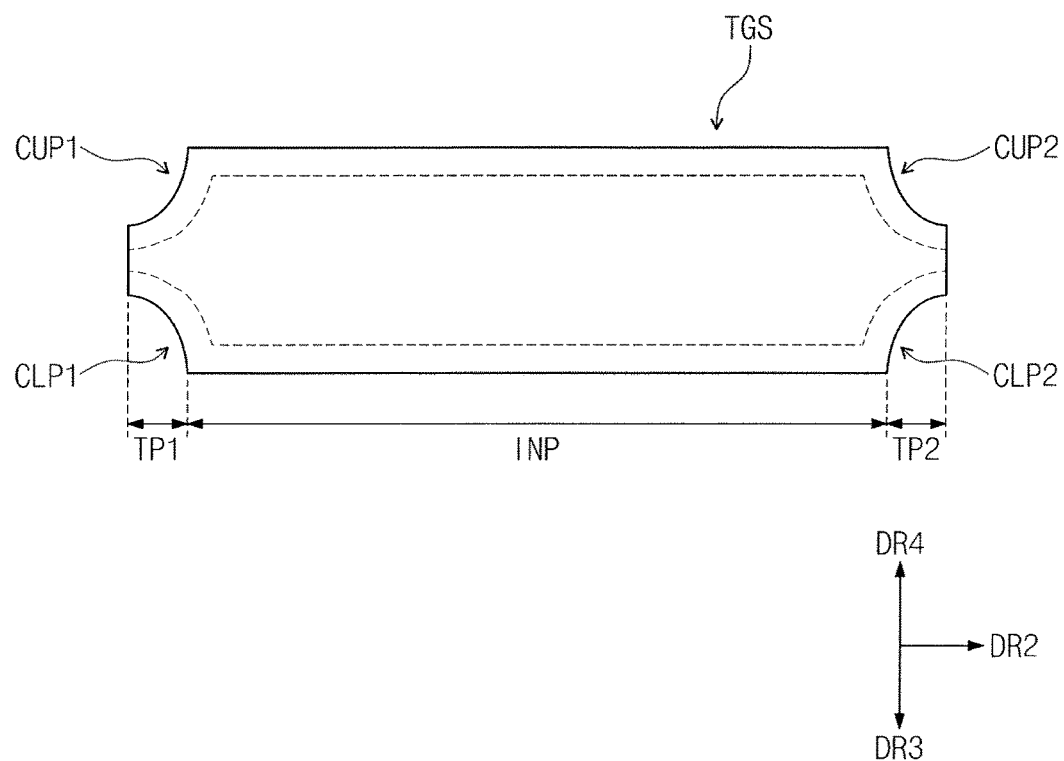

The first terminal portion TP1 may be connected to the intermediate portion INP. The first terminal portion TP1 may include one end exposed to the outside. Referring to FIGS. 14A and 14B, the first terminal portion TP1 may include an upper surface TUF1 having a curved shape. In some implementations, as shown in FIGS. 14C and 14D, the first terminal portion TP1 may has an upper surface TUF1 having a planar shape. Referring to FIGS. 14A and 14B, the first terminal portion TP1 may include a lower surface TLF1 having a curved shape. In some implementations, referring to FIGS. 14C and 14D, the first terminal portion TP1 may include a lower surface TLF1 having a planar shape.

The first terminal portion TP1 may include a tensile stress layer, a first compressive stress layer, and a second compressive stress layer. The first compressive stress layer may be disposed on an upper surface of the tensile stress layer. The second compressive stress layer may be disposed on a lower surface of the tensile stress layer.

The first terminal portion TP1 may include first concave patterns CUP1 and CLP1. The first concave patterns CUP1 and CLP1 may be recessed with respect to outer surfaces IUF and ILF of the intermediate portion INP. The first concave patterns CUP1 and CLP1 may include a first upper concave pattern CUP1 and a first lower concave pattern CLP1. The first upper concave pattern CUP1 may be located in a upper portion of the first terminal portion TP1. The first upper concave pattern CUP1 may be concave when viewed from an upper side. The first lower concave pattern CLP1 may be located in a lower portion of the first terminal portion TP1. The first upper concave pattern CUP1 may be concave when viewed from a lower side. Although the first concave patterns CUP1 and CLP1 having both of the first upper concave pattern CUP1 and the first lower concave pattern CLP1 are described as an example, in some implementations, the first concave patterns CUP1 and CLP1 may include one of the first upper concave pattern CUP1 and the first lower concave pattern CLP1.

The first upper concave patterns CUP1 and CLP1 may have various shapes. For example, the first concave patterns CUP1 and CLP1 may have a shape that constitutes a portion of a circle, a portion of an oval, a portion of a triangle, or a portion of a quadrangle on a cross-section. For example, referring to FIG. 14A, the first concave patterns CUP1 and CLP1 may have a shape that constitutes a portion of a circle in a cross-section. Referring FIG. 14B, the first concave patterns CUP1 and CLP1 may have a shape that constitutes a portion of an oval in a cross-section. Referring FIG. 14C, each of the first concave patterns CUP1 and CLP1 may have a shape that constitutes a portion of a triangle in a cross-section. Referring FIG. 14D, each of the first concave patterns CUP1 and CLP1 may have shape that constitutes a portion of a quadrangle in a cross-section.

The second terminal portion TP2 may be connected to the intermediate portion INP. The second terminal portion TP2 may be spaced apart from the first terminal portion TP1. The second terminal portion TP2 may include one end exposed to the outside. Referring to FIGS. 14A and 14B, the second terminal portion TP2 may include an upper surface TUF2 having a curved shape. In some implementation, referring to FIGS. 14C and 14D, the second terminal portion TP2 may has a upper surface TUF2 having a planar shape. Referring to FIGS. 14A and 14B, the second terminal portion TP2 may include a lower surface TLF2 having a curved shape. In some implementations, referring to FIGS. 14C and 14D, the second terminal portion TP2 may has a lower surface TLF2 having a planar shape.

The second terminal portion TP2 may include a tensile stress layer, a first compressive stress layer, and a second compressive stress layer. The first compressive stress layer may be disposed on an upper surface of the tensile stress layer. The second compressive stress layer may be disposed on a lower surface of the tensile stress layer.

The second terminal portion TP2 may include second concave patterns CUP2 and CLP2. The second concave patterns CUP2 and CLP2 may be recessed with respect to the outer surfaces IUF and ILF of the intermediate portion INP. The second concave patterns CUP2 and CLP2 may include a second upper pattern CUP2 and a second lower pattern CLP2. The second upper concave pattern CUP2 may be located in an upper portion of the second terminal portion TP2. The second upper concave pattern CUP2 may be concave when viewed from an upper side. The second lower concave pattern CLP2 may be located in a lower portion of the second terminal portion TP2. The second lower concave pattern CLP2 may be concave when viewed from a lower side. The second concave patterns CUP2 and CLP2 including both of the second upper concave pattern CUP2 and the second lower concave pattern CLP2 are described as an example. In some implementations, for example, the second concave patterns CUP2 and CLP2 may include only one of the second upper concave patterns CUP2 and the second lower concave pattern CLP2.

The second concave patterns CUP2 and CLP2 may have various shapes. For example, the second concave patterns CUP2 and CLP2 may have a shape that constitutes a portion of a circle, a portion of an oval, a portion of a triangle, or a portion of a quadrangle on a cross-section. For example, referring to FIG. 14A, the second concave patterns CUP2 and CLP2 may have a shape that constitutes a portion of a circle in a cross-section. Referring FIG. 14B, the second concave patterns CUP2 and CLP2 may have a shape that constitutes a portion of an oval in a cross-section. Referring FIG. 14C, the second concave patterns CUP2 and CLP2 may have a shape that constitutes a portion of a triangle in a cross-section. Referring FIG. 14D, each of the second concave patterns CUP2 and CLP2 may have a shape that constitutes a portion of a quadrangle on a cross-section.

Figure 15:
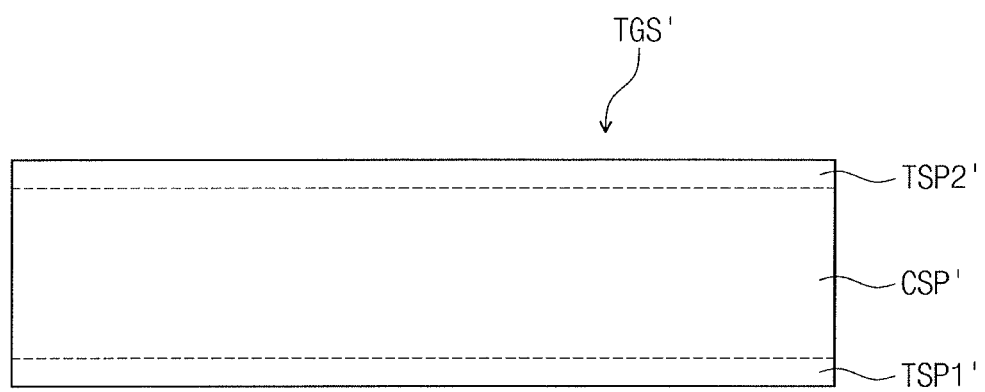
FIG. 15 illustrates a schematic cross-sectional view of a reinforced glass substrate provided in a display device according to the related art.

By way of summation and review, FIG. 15 illustrates a schematic cross-sectional view of a reinforced glass substrate included in a general display device.

Referring to FIGS. 14A and 15, a general reinforced glass substrate TGS' has uniform thickness. In more detail, each of a first compressive stress layer TSP1', a second compressive stress layer TSP2', and a tensile stress layer CSP' has uniform thickness. Accordingly, a tensile stress layer CSP' may have a large area to be exposed to the outside, when compared to the reinforced glass substrate TGS according to an embodiment. Thus, it may be difficult to maintain strength of the side surfaces.

On the other hand, in the method for fabricating the reinforced glass substrate according to an embodiment and the method for fabricating the display device according to an embodiment includes, the groove patterns are formed, and then, the reinforced plate glass is cut with respect to the groove patterns to form the reinforced glass substrate TGS including the concave patterns CUP1, CUP2, CLP1, and CLP2. Thus, the reinforced glass substrate TGS of which at least one of the first terminal portions TP1 and TP2 has a thickness t1 less than a thickness t2 of the intermediate portion INP adjacent to the center of gravity of the reinforced glass substrate may be obtained. Also, when compared to the typical reinforced glass substrate TGS', the reinforced glass substrate TGS according to an embodiment may have a decreased area in the portion of the side surface that is exposed to the outside. Thus, the side surface of the reinforced substrate TGS may be improved in strength.

Also, in the method for fabricating the reinforced glass substrate according to an embodiment and the method for fabricating the display device according to an embodiment, processes of forming the groove patterns and cutting with respect to the groove patterns may be added to the method for fabricating the typical reinforced glass substrate to obtain the reinforced glass substrate TGS having the improved side surface strength through the simplified processes without performing a separate side surface reinforcing process.

A general reinforced glass substrate, which is provided in the display device fabricated by using the method for fabricating the general display device, has a uniform thickness. Thus, when compared to the reinforced glass substrate fabricated by using the method for fabricating the display device according to an embodiment, the general reinforced glass substrate may have an area of a side surface that is relatively greater than that of the reinforced glass substrate. Therefore, with the general reinforced glass substrate, a side surface of the reinforced glass substrate may have relatively weak strength when compared to those of upper and lower surfaces and it may be difficult to maintain the strength of the side surface.

However, in the method for fabricating the display device according to an embodiment, the first groove patterns are formed, and then, the reinforced plate glass is cut with respect to the first groove patterns to form the reinforced glass substrate. Therefore, the reinforced glass substrate, which has at least one end having a thickness less than that of region adjacent to the center of gravity, may be obtained. The reinforced glass substrate, which is provided in the display device fabricated by using the method according to an embodiment, may decrease in area by which the tensile stress layer is exposed through the side surface, when compared to the general reinforced glass substrate fabricated by using the method for fabricating the typical display device. Therefore, the reinforced glass substrate may have the improved side surface strength.

Also, in the method for fabricating the display device according to an embodiment of the inventive, processes of forming the groove patterns and cutting with respect to the groove patterns may be added to the method for fabricating the typical reinforced glass substrate to obtain the reinforced glass substrate TGS having the improved side surface strength through the simplified processes without performing a separate side surface reinforcing process.

In the method of fabricating the reinforced glass substrate according to an embodiment, the reinforced glass substrate having increased side surface strength may be fabricated.

In the method of fabricating the display device according to an embodiment, the display device including the reinforced glass substrate having increased side surface strength may be fabricated.

In the display device according to an embodiment, the reinforced glass substrate having increased side surface strength may be provided to improve the durability of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method for fabricating a reinforced glass substrate, the method comprising:
   forming a plurality of groove patterns in at least one surface of a plate glass;
   applying an ion exchange paste to the at least one surface in which the groove patterns are formed such that the ion exchange paste covers the at least one surface and fills the groove patterns;
   applying an electric field to the plate glass coated with the ion exchange paste to form a reinforced plate glass; and
   cutting the reinforced plate glass to form a reinforced glass substrate.

2. The method as claimed in claim 1, wherein forming the groove patterns is performed by applying laser or heat energy to the at least one surface.

3. The method as claimed in claim 1, wherein forming the groove patterns includes forming a plurality of first groove patterns that extend in a first direction and that are spaced apart from each other in a second direction crossing the first direction on a first surface of the plate glass.

4. The method as claimed in claim 3, wherein each of the first groove patterns is formed to be concave when viewed from an upper side of the plate glass.

5. The method as claimed in claim 3, wherein forming the groove patterns further includes forming a plurality of second groove patterns on a second surface of the plate glass, the second surface being an opposite surface of the plate glass from the first surface.

6. The method as claimed in claim 5, wherein forming the second groove patterns includes forming the second groove patterns to extend in the first direction and to be spaced apart from each other in the second direction.

7. The method as claimed in claim 5, wherein each of the second groove patterns is formed to be concave, when viewed from a lower side of the plate glass.

8. The method as claimed in claim 5, wherein each of the second groove patterns is formed to overlap a respective one of the first groove patterns.

9. The method as claimed in claim 5, wherein applying the ion exchange paste includes:
   applying the ion exchange paste to contact the first surface in which the first groove patterns are formed, thereby forming a first ion exchange paste layer; and
   applying the ion exchange paste to contact the second surface in which the second groove patterns are formed, thereby forming a second ion exchange paste layer.

10. The method as claimed in claim 9, wherein forming the reinforced plate glass includes:
    connecting the first ion exchange paste layer to a first electrode;
    connecting the second ion exchange paste layer to a second electrode; and
    applying a voltage to at least one of the first electrode and the second electrode.

11. The method claim 1, wherein the ion exchange paste as applied contains $K^+$ ions.

12. The method as claimed in claim 1, wherein forming the reinforced glass substrate includes applying laser energy or a cutting wheel to cut the reinforced plate glass, thereby forming the reinforced glass substrate.

13. The method as claimed in claim 1, wherein forming the reinforced glass substrate includes cutting the reinforced plate glass along a cutting reference line that overlaps at least one of the groove patterns to form the reinforced glass substrate.

14. The method as claimed in claim 1, wherein, the reinforced glass substrate includes:
    a tensile stress layer that receives a tensile stress;

a first compressive stress layer that contacts one surface of the tensile stress layer to receive a compressive stress; and a second compressive stress layer that contacts another surface of the tensile stress layer to receive a compressive stress.

15. The method as claimed in claim 1, wherein forming the reinforced glass substrate includes forming the reinforced glass substrate to have at least one end having a thickness that is less than a thickness of a region adjacent to a center of gravity of the reinforced glass substrate.

16. The method as claimed in claim 1, further including cleaning the reinforced plate glass.

17. A method for fabricating a display device, the method comprising:

forming a plurality of groove patterns in at least one surface of a plate glass;

applying ion exchange paste to the at least one surface in which the groove patterns are formed such that the ion exchange paste covers the at least one surface and fills the groove patterns;

applying an electric field to the plate glass coated with the ion exchange paste to form a reinforced plate glass;

cutting the reinforced plate glass to form a reinforced glass substrate; and forming a display device including the reinforced glass substrate.

18. The method as claimed in claim 17, wherein forming the display device includes at least one of:

forming a window member;

forming a touch sensing unit; and forming a display panel.

19. The method claim 17, wherein forming the groove patterns is performed by applying laser or heat energy to the at least one surface.

20. The method as claimed in claim 17, wherein forming the reinforced glass substrate includes providing laser energy or a cutting wheel to cut the reinforced plate glass, thereby forming the reinforced glass substrate.

\* \* \* \* \*